US011333692B2

(12) United States Patent
Myoga

(10) Patent No.: US 11,333,692 B2
(45) Date of Patent: May 17, 2022

(54) DEFORMATION APPARATUS, EXPOSURE APPARATUS, AND METHOD OF MANUFACTURING ARTICLE

(71) Applicant: CANON KABUSHIKI KAISHA, Tokyo (JP)

(72) Inventor: Arata Myoga, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/324,168

(22) Filed: May 19, 2021

(65) Prior Publication Data
US 2021/0382099 A1 Dec. 9, 2021

(30) Foreign Application Priority Data
Jun. 3, 2020 (JP) .............................. JP2020-097146

(51) Int. Cl.
*G01R 23/02* (2006.01)
*G02B 26/08* (2006.01)
*G01R 19/00* (2006.01)
*G03F 7/20* (2006.01)

(52) U.S. Cl.
CPC ......... *G01R 23/02* (2013.01); *G01R 19/0084* (2013.01); *G02B 26/0825* (2013.01); *G03F 7/70191* (2013.01)

(58) Field of Classification Search
CPC ................ G01R 23/02; G01R 19/0084; G02B 26/0825; G03F 7/70191

USPC ...................................................... 355/72–76
See application file for complete search history.

(56) References Cited

U.S. PATENT DOCUMENTS

| 4,666,291 A | * | 5/1987 | Taniguchi | ............... G03F 7/703 355/76 |
| 5,564,682 A | * | 10/1996 | Tsuji | ................... H01L 21/6838 269/21 |
| 6,313,567 B1 | * | 11/2001 | Maltabes | ................ G03F 7/707 702/39 |

FOREIGN PATENT DOCUMENTS

JP         2015065246 A      4/2015

* cited by examiner

*Primary Examiner* — Hung V Nguyen
(74) *Attorney, Agent, or Firm* — Rossi, Kimms & McDowell LLP

(57) ABSTRACT

The present invention provides a deformation apparatus that deforms a surface of a member, the apparatus comprising: a plurality of actuators each of which is configured to apply a force to the member to deform the surface; a measurement device configured to measure an induced electromotive force generated in a first actuator of the plurality of actuators; and a controller configured to control the plurality of actuators, wherein the controller causes the measurement device to measure a temporal variation of an induced electromotive force in the first actuator while vibrating the member by using a second actuator, of the plurality of actuators, which is different from the first actuator, converts the measured temporal variation of the induced electromotive force into a frequency spectrum, and detects an abnormality in the first actuator based on the frequency spectrum.

16 Claims, 10 Drawing Sheets

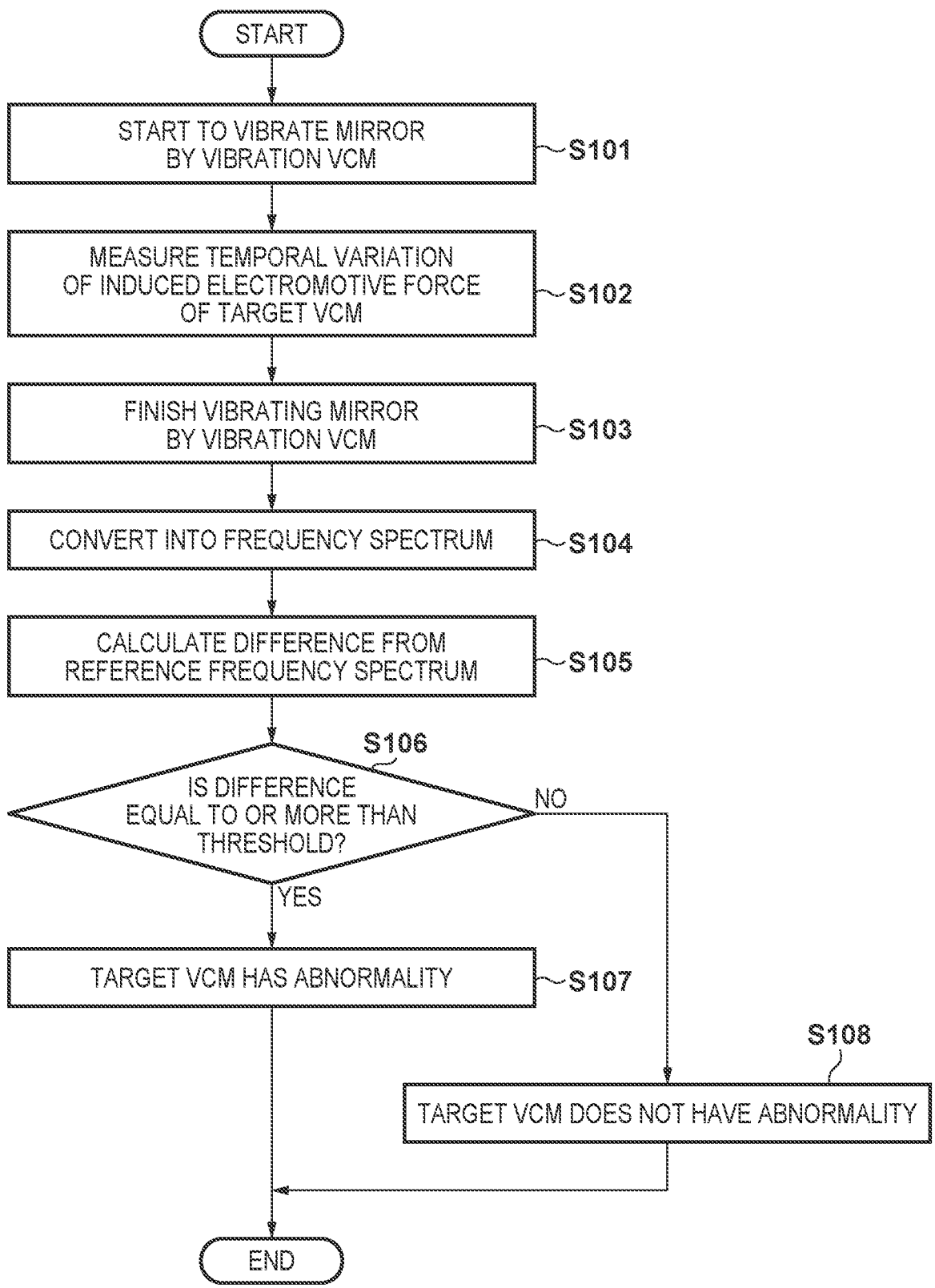

DEFORMATION APPARATUS, EXPOSURE APPARATUS, AND METHOD OF MANUFACTURING ARTICLE

BACKGROUND OF THE INVENTION

Field of the Invention

The present invention relates to a deformation apparatus, an exposure apparatus, and a method of manufacturing an article.

Description of the Related Art

An exposure apparatus used to manufacture semiconductor devices, liquid crystal display devices, and the like is required to correct the optical aberration of a projection optical system in order to improve the imaging characteristic. Accordingly, the exposure apparatus can be provided with an optical apparatus that corrects the optical aberration of the projection optical system by deforming a mirror of the projection optical system by applying a force to the mirror using a plurality of actuators. For the optical apparatus, it is preferable to use an actuator resistant to hysteresis, such as a voice coil motor (to be sometimes referred to as a "VCM" hereinafter) having a coil and a magnet from the viewpoint of accurately controlling the deformation of the mirror.

In this case, if the optical apparatus has an actuator in which an abnormality has occurred, the optical aberration of the mirror may not be sufficiently corrected by being accurately deformed. For this reason, it is preferable to periodically inspect (detect) an abnormality in each actuator. Japanese Patent Laid-Open No. 2015-65246 proposes a method of correcting the thrust variation of each VCM in the optical apparatus. More specifically, a reference VCM of a plurality of VCMs is driven by a unit amount to measure the induced electromotive forces generated in the coils of the remaining VCMs. The thrust variations of the remaining VCMs are corrected based on the measurement results.

When a reference VCM is driven by a unit amount as in the method disclosed in Japanese Patent Laid-Open No. 2015-65246, the induced electromotive forces generated in the coils of the remaining VCMs are minute, and the S/N ratio is very low. This can make it difficult to efficiently and accurately detect an abnormality in each actuator based on the induced electromotive force.

SUMMARY OF THE INVENTION

The present invention provides a technique advantageous in efficiently and accurately detecting an abnormality in actuators that deform the surface of a member such as an optical element (mirror).

According to one aspect of the present invention, there is provided a deformation apparatus that deforms a surface of a member, the apparatus comprising: a plurality of actuators each of which is configured to apply a force to the member to deform the surface; a measurement device configured to measure an induced electromotive force generated in a first actuator of the plurality of actuators; and a controller configured to control the plurality of actuators, wherein the controller causes the measurement device to measure a temporal variation of an induced electromotive force in the first actuator while vibrating the member by using a second actuator, of the plurality of actuators, which is different from the first actuator, converts the measured temporal variation of the induced electromotive force into a frequency spectrum, and detects an abnormality in the first actuator based on the frequency spectrum.

Further features of the present invention will become apparent from the following description of exemplary embodiments with reference to the attached drawings.

BRIEF DESCRIPTION OF THE DRAWINGS

FIG. 2 is a flowchart showing a method of detecting an abnormality in a target VCM;

DESCRIPTION OF THE EMBODIMENTS

Figure 1:
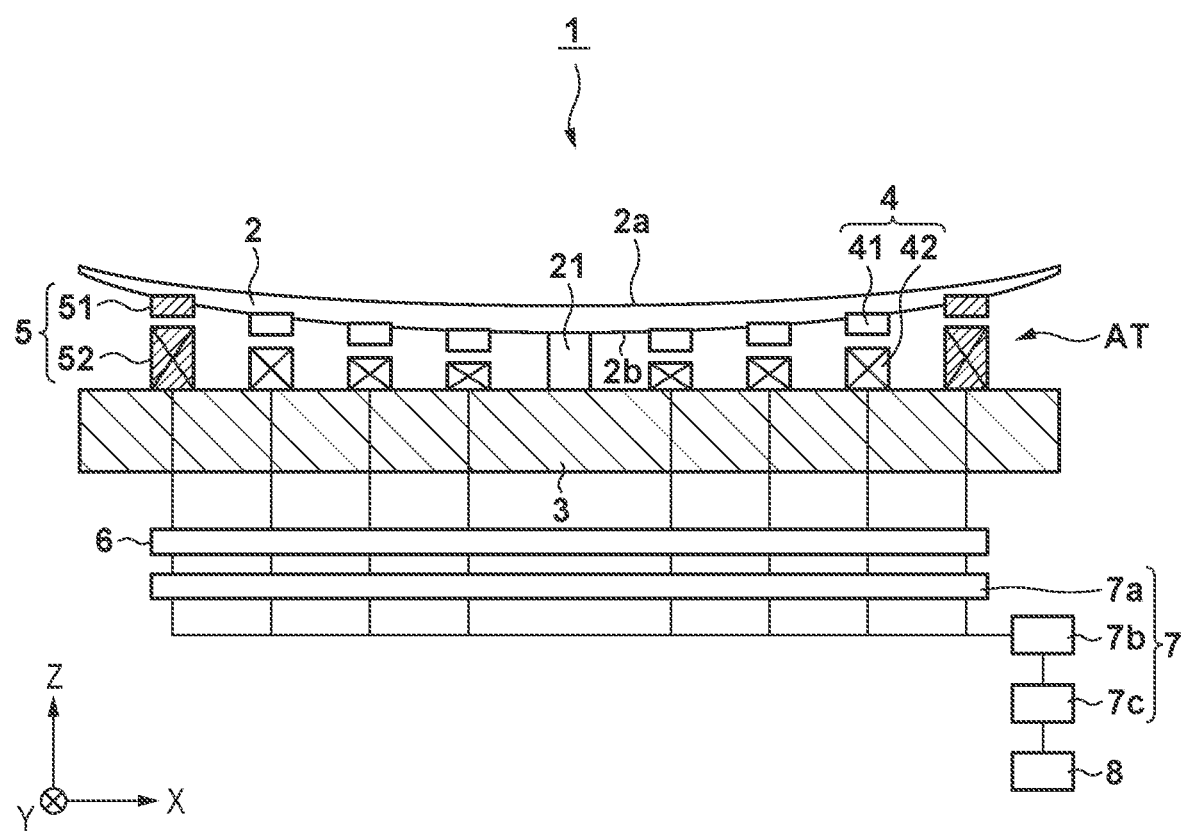
FIG. 1 is a schematic view showing the arrangement of a deformation apparatus according to the first embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

Each embodiment described below will exemplify a mirror (optical element) as a target member to be deformed. However, the mirror can be replaced with another optical element (a lens, parallel plate prism, or prism), another member (a mask stage or substrate stage), or the like. In addition, each embodiment will exemplify a voice coil motor (VCM) as an actuator for deforming the reflecting surface (optical surface) of the mirror (optical element). However, the voice coil motor can be replaced with an actuator using an electromagnetic force, such as a linear motor or solenoid. The actuator is arranged between an optical element and a base plate that supports the optical element and can be constituted by a magnet fixed to one of the optical element and the base plate and a coil fixed to the other. For example, the actuator has one of the magnet and the coil arranged on a surface of the optical element which is located on the opposite side to the optical surface, with the other being arranged on the base plate. Making a current flow in the coil can apply a force to the optical element and deform the optical surface of the optical element.

First Embodiment

FIG. 1 is a schematic view showing the arrangement of a deformation apparatus 1 according to the first embodiment of the present invention. The deformation apparatus 1 according to this embodiment is an optical apparatus that deforms a reflecting surface 2a (optical surface) of a mirror 2. The deformation apparatus 1 can include, for example, a mirror holding member 21, a base plate 3, a plurality of actuators AT, a measurement device 6, a controller 7, and a display unit 8.

The mirror 2 is supported by the base plate 3 through the mirror holding member 21. The base plate 3 is attached to the housing (not shown) of the deformation apparatus 1. The deformation apparatus 1 is used in combination with a light-receiving element, other optical systems, and the like.

The plurality of actuators AT each can function as an actuator that applies a force to the mirror 2 when deforming the reflecting surface 2a of the mirror 2 into a desired shape (that is, in an operation other than detecting an abnormality in the deformation apparatus 1). In contrast to this, the plurality of actuators AT each is assigned either of the functions of a target actuator 4 (first actuator) and a vibration actuator 5 (second actuator) at the time of abnormality detection by the deformation apparatus 1. The target actuator 4 is an actuator in which an abnormality is to be detected by the measurement of an induced electromotive force with the measurement device 6. In this embodiment, a voice coil motor (VCM) is used as the target actuator 4, which will sometimes be called the target VCM 4 hereinafter. The vibration actuator 5 is an actuator for vibrating (applying vibration to) the mirror 2 by applying a force to a reverse surface 2b (the surface on the opposite side to the reflecting surface 2a) of the mirror 2 when detecting an abnormality in the target actuator 4 (VCM 4). In this embodiment, a voice coil motor (VCM) is used as the vibration actuator 5, which will sometimes be called the VCM 5 hereinafter.

In this case, the functions of the target actuator 4 and the vibration actuator 5 may be exchanged with each other. For example, when the deformation apparatus 1 detects an abnormality, these functions can be selected from the plurality of actuators AT as appropriate. In addition, in this embodiment, actuators (VCMs) of the same type are used as the target actuator 4 and the vibration actuator 5. However, this is not exhaustive, and different types of actuators may be used. That is, as the vibration actuator 5, an actuator different from a VCM may be used. The number of actuators AT is not specifically limited and can be arbitrarily set in accordance with, for example, shape accuracy required for the reflecting surface 2a of the mirror 2.

The VCM 4 includes a movable element 41 arranged on the reverse surface 2b of the mirror 2 and a stator 42 arranged on the base plate 3. In this embodiment, the movable element 41 and the stator 42 are a magnet and a coil respectively so as not to arrange additional elements such as wirings on the mirror 2 on the movable element side. Likewise, the vibration VCM 5 includes a magnet as a movable element 51 arranged on the reverse surface 2b of the mirror 2 and a stator 52 arranged on the base plate 3, and applies a force to the reverse surface 2b of the mirror 2. The number of target VCMs 4 and the number of vibration VCMs 5 can be arbitrarily set in accordance with the accuracy of detection of an abnormality in the deformation apparatus 1 (that is, an abnormality in the target VCM 4). However, the number of vibration VCMs 5 is preferably smaller than that of target VCMs 4 to allow detection of an abnormality in the plurality of target VCMs 4 by vibrating the mirror 2 with, for example, one vibration VCM 5.

The measurement device 6 is provided for each of the plurality of actuators AT to measure the induced electromotive force (induced voltage) generated in each of the plurality of target VCMs 4. In this embodiment, the measurement device 6 measures the induced electromotive force generated in the coil of the target VCM 4 by vibrating the mirror 2 using the vibration VCM 5 of the plurality of actuators AT.

The controller 7 is constituted by, for example, a computer having a CPU, a memory, and the like, and controls the overall deformation apparatus 1. In this embodiment, the controller 7 can include a drive controller 7a, a processor 7b (arithmetic unit), and a storage unit 7c. The drive controller 7a controls the drive of each of the plurality of actuators AT. The processor 7b detects an abnormality in the target VCM 4 based on the induced electromotive force measured by the measurement device 6. The storage unit 7c has a storage medium such as a memory and stores various types of data and information.

The deformation apparatus 1 according to this embodiment includes a display unit 8 (display). The display unit 8 can display the position information of the actuator AT (target VCM 4) in which an abnormality has been detected by the controller 7 (processor 7b). In this case, according to this embodiment, the display unit 8 is a constituent element of the deformation apparatus 1. However, this is not exhaustive, and may be a constituent element of an external apparatus different from the deformation apparatus 1. In this case, the controller 7 (processor 7b) of the deformation apparatus 1 can notify the user (operator) of an abnormality in the deformation apparatus 1 by transmitting (outputting), to the external apparatus, the position information of the actuator AT (target VCM 4) in which the abnormality has been detected.

[Method of Detecting Abnormality in Target VCM]

In the deformation apparatus 1 described above, an abnormality sometimes occurs in each actuator AT due to, for example, temporal deterioration. A VCM used as each actuator is constituted by a magnet (movable element) and a coil (stator) in a non-contact state. Only the coil can directly detect an abnormality. For this reason, an abnormality in the magnet, such as peeling or dropping of the magnet from the mirror 2 needs to be indirectly detected based on the result of measuring the induced electromotive force generated in the coil when the distance between the magnet and the coil is changed.

However, when the distance between the magnet and the coil is changed by a predetermined amount (unit amount) by applying an external force to the mirror 2, the resulting induced electromotive force in the coil is minute, and the SN ratio is very low. For this reason, only using the measurement result of the induced electromotive force without any process can make it difficult to detect an abnormality in the actuator AT (magnet). Accordingly, the controller 7 according to this embodiment causes the measurement device 6 to measure temporal variation (variation over time) in the induced electromotive force of the target VCM 4 (coil) while vibrating the mirror 2 using the vibration VCM 5. The controller 7 converts the temporal variation of the measured induced electromotive force into a frequency spectrum and detects an abnormality in the target VCM 4 based on the frequency spectrum. A frequency spectrum is defined as information indicating the strength of induced electromotive force for each frequency (that is, with respect to each frequency), and is expressed as a graph with the abscissa representing frequency and the ordinate representing the strength of induced electromotive force.

In this case, the types of abnormalities that can be detected in this embodiment include, for example, the position change of the movable element 41 (magnet), a change in magnetic permeability caused by the temperature change of the movable element 41, a breakage of the movable element 41, and the non-mounting, peeling, and dropping of the movable element 41 with respect to the mirror 2. When the position of the movable element 41 changes, the interlinkage magnetic flux to the stator 42 (coil) changes, and hence the induced electromotive force changes with an increase/decrease in interlinkage magnetic flux. When the magnetic permeability of the movable element 41 changes, the induced electromotive force changes in accordance with the amount of change in magnetic permeability. In addition, when the non-mounting, breakage, peeling, or dropping of the movable element occurs, the induced electromotive force greatly decreases.

FIG. 2 is a flowchart showing a method of detecting an abnormality in the target VCM 4 according to this embodiment. For the sake of simplicity, the following will describe an example of detecting an abnormality in one target VCM 4 by using one vibration VCM 5. Note that the controller 7 can control each step in the flowchart shown in FIG. 2.

In step S101, the controller 7 starts to vibrate the mirror 2 by starting to drive the vibration VCM 5 using the drive controller 7a. As a method of driving the vibration VCM 5, an arbitrary driving method can be used. For example, there are available an impulse-like driving method, a pulse-like driving method, a stepwise driving method, and a periodical driving method based on a single frequency. A periodical driving method is preferably used to continuously vibrate the mirror 2.

For example, the controller 7 may perform periodic driving to control (drive) the vibration VCM 5 such that the vibration frequency of the mirror 2 includes a single frequency component. Alternatively, the controller 7 may control the vibration VCM 5 such that the vibration frequency of the mirror 2 includes a plurality of frequency components. Methods of controlling the vibration VCM 5 such that the vibration frequency includes a plurality of frequency components include a method of controlling the vibration VCM 5 so as to sweep the vibration frequency of the mirror 2 and a method of controlling the vibration VCM 5 such that the vibration frequency of the mirror 2 includes white noise. The controller 7 may control the vibration VCM 5 such that the vibration frequency of the mirror 2 includes the resonance frequency of the mirror 2. Controlling the vibration VCM 5 such that the vibration frequency includes the resonance frequency of the mirror 2 can easily increase the vibration of the mirror 2. In this case, the range in which the vibration frequency of the mirror 2 is swept can be changed as appropriate in accordance with the size, weight, or the like of the mirror 2. For example, this range can be set to the range from 20 Hz to 120 Hz. In addition, white noise means noise including an audio frequency component.

In step S102, the controller 7 causes the measurement device 6 to measure the temporal variation (variation over time) of the induced electromotive force generated in the target VCM 4. For example, the controller 7 can obtain the temporal variation of the induced electromotive force generated in the target VCM 4 by making the measurement device 6 continuously measure the induced electromotive force generated in the target VCM 4 while making the vibration VCM 5 vibrate the mirror 2 in a predetermined period. Upon completion of the measurement of the temporal variation of the induced electromotive force generated in the target VCM 4, the controller 7 advances to step S103 to cause the vibration VCM 5 to finish vibrating the mirror 2.

Figure 3A:
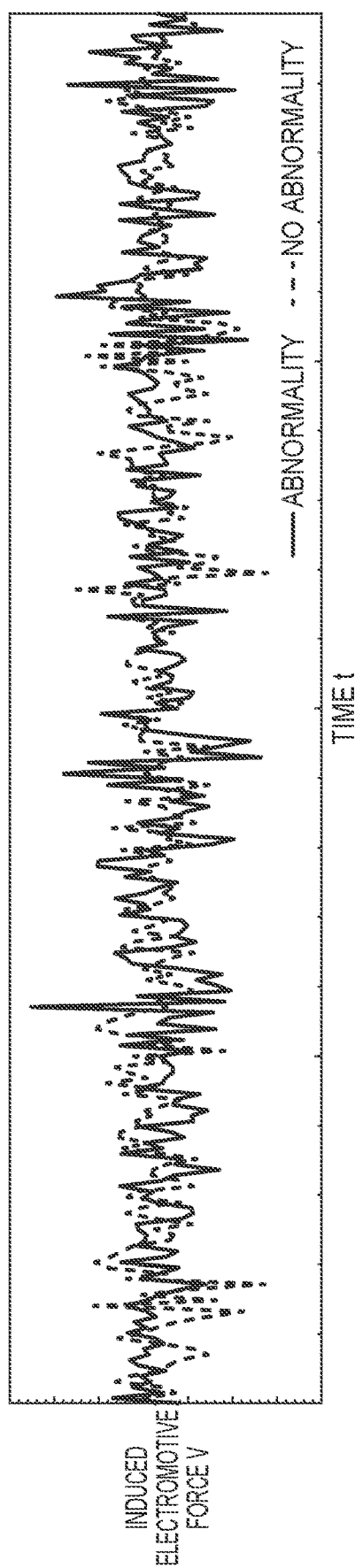
FIG. 3A is a graph showing an example of the temporal variation of the induced electromotive force of a target VCM.

FIG. 3A shows an example of the temporal variation of the induced electromotive force in the target VCM 4 which is measured by the measurement device 6. The temporal variation of induced electromotive force is defined as information indicating the strength of induced electromotive force with respect to the elapsed time since the start of measurement, and is expressed as a graph with the abscissa representing elapsed time t since the start of measurement and the ordinate representing a strength V of induced electromotive force measured by the measurement device 6, as shown in FIG. 3A. Referring to FIG. 3A, the solid line indicates the temporal variation of the induced electromotive force measured when the target VCM 4 has an abnormality, and the broken line indicates the temporal variation of the induced electromotive force measured when the target VCM 4 has no abnormality. Obviously, as shown in FIG. 3A, using the temporal variation of the induced electromotive force measured by the measurement device 6 itself makes it difficult to detect whether the target VCM 4 has an abnormality, because the measurement values of induced electromotive forces are buried among noise, secondary harmonics, and the like.

In step S104, the controller 7 (processor 7b) converts the temporal variation of the induced electromotive force measured in step S102 into a frequency spectrum. For example, the controller 7 can obtain (calculate) the frequency spectrum of the induced electromotive force in the target VCM 4 by performing FFT (Fast Fourier Transform) for the temporal variation of the induced electromotive force measured in step S102.

Figure 3B:
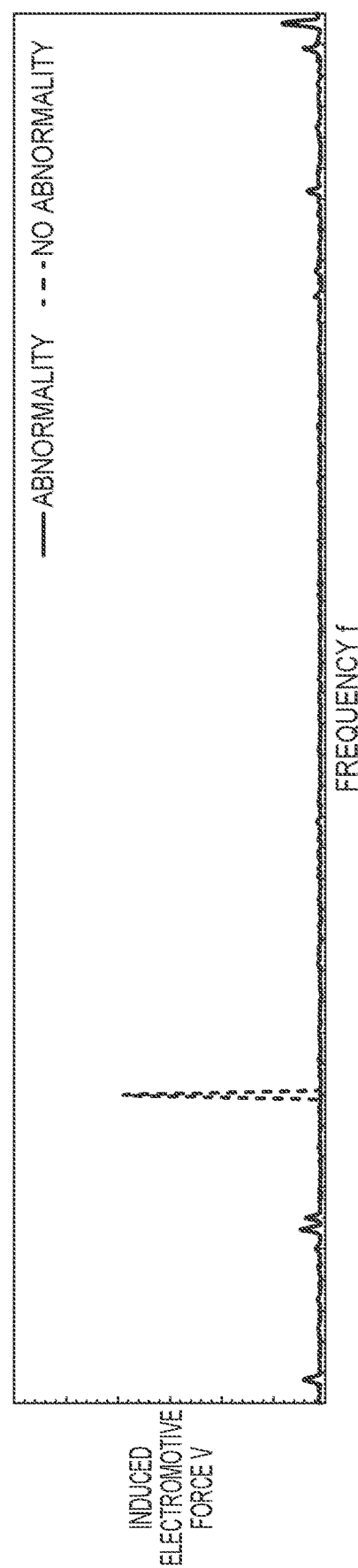
FIG. 3B is a graph showing an example of a frequency spectrum.

FIG. 3B shows an example of the frequency spectrum obtained by performing fast Fourier transform for the measurement results on the temporal variation of the induced electromotive force in the target VCM 4. As described above, a frequency spectrum is defined as information indicating the strength of induced electromotive force with respect to a frequency, and can be expressed as a graph with the abscissa representing a frequency f and the ordinate representing a strength V of induced electromotive force, as shown in FIG. 3B. Referring to FIG. 3B, the solid line indicates the frequency spectrum when the target VCM 4 has an abnormality, and the broken line indicates the frequency spectrum when the target VCM 4 has no abnormality. Obviously, as shown in FIG. 3B, when the target VCM 4 has no abnormality (broken line), an induced electromotive force peak can be obtained at a frequency corresponding to the vibration frequency of the mirror 2, whereas when the target VCM 4 has an abnormality such as the peeling, dropping, or the like of the magnet (solid line), the peak cannot be obtained. That is, using a frequency spectrum makes it possible to efficiently and accurately determine whether the target VCM 4 has an abnormality.

In step S105, the controller 7 obtains the difference between the frequency spectrum obtained in step S104 and a reference frequency spectrum by comparing them. As the reference frequency spectrum, the frequency spectrum of the target VCM 4 which is acquired in advance without any abnormality in the target VCM 4 (for example, the frequency spectrum indicated by the broken line in FIG. 3B) can be used.

In step S106, the controller 7 determines whether the difference obtained in step S105 is equal to or more than a threshold. If the controller 7 determines that the difference is equal to or more than the threshold, the process advances to step S107 in which the controller 7 can determine that the VCM 4 has an abnormality. If the controller 7 determines that the difference is less than the threshold, the process advances to step S108, in which the controller 7 can determine that the target VCM 4 has no abnormality. As described, in this embodiment, converting the temporal variation of the induced electromotive force in the target VCM 4 into a frequency spectrum makes it possible to efficiently and accurately detect an abnormality in the target VCM 4 based on the frequency spectrum.

The following will describe the temporal variation of the induced electromotive force in the target VCM 4 which is obtained in accordance with a driving method for the vibration VCM 5 (a driving method for the mirror 2) and the frequency spectrum.

Figure 4A:
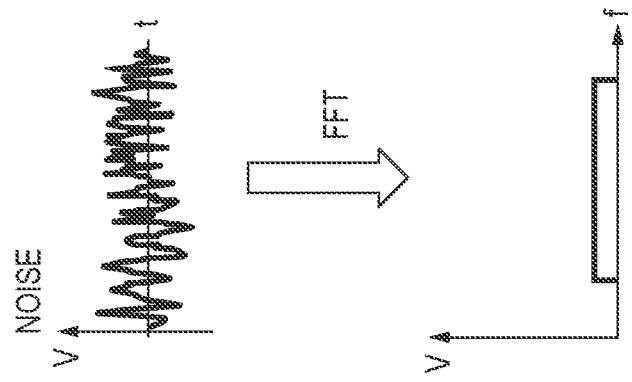
FIGS. 4A to 4C are graphs for explaining the temporal variation of the induced electromotive force in a target VCM obtained by a method of driving a vibration VCM and a frequency spectrum.

FIG. 4A shows an example of controlling the vibration VCM 5 such that the vibration frequency of the mirror 2 includes a single frequency component. A feature in this case is that because the applied vibration of the mirror 2 can be increased, it is possible to increase the induced electromotive force generated in the coil of the target VCM 4 by greatly vibrating the mirror 2.

Figure 4B:
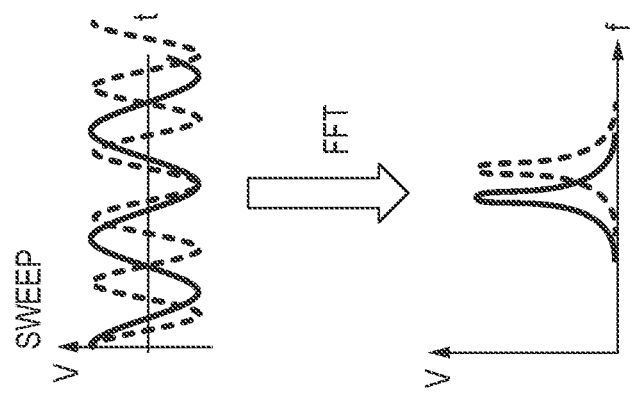

FIG. 4B shows an example of controlling the vibration VCM 5 such that the vibration frequency of the mirror 2 includes a plurality of frequency components (an example of sweeping the vibration frequency of the mirror 2). A feature in this case is that because the applied vibration amount can be increased and the number of peaks corresponding to the number of frequency components of the vibration frequency of the mirror 2 can be obtained in the frequency spectrum, it is possible to increase the width of analysis concerning an abnormality in the target VCM 4. For example, as shown in FIG. 4B, when two frequency components are used, two peaks can be obtained in a frequency spectrum, and an abnormality can be detected in the target VCM 4 based on the two peaks. This can reduce the false detection of an abnormality in the target VCM 4 and accurately detect an abnormality in the target VCM 4.

Figure 4C:
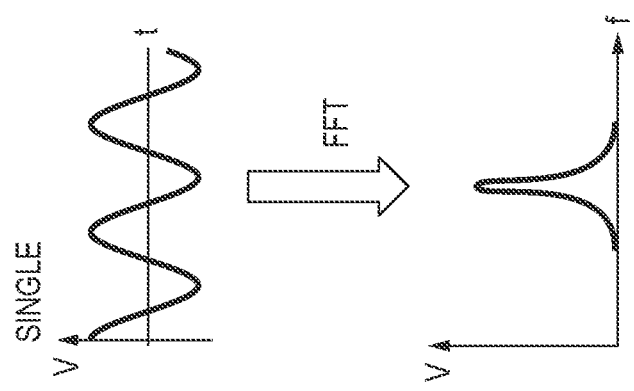

FIG. 4C shows an example of controlling the vibration VCM 5 such that the vibration frequency of the mirror 2 includes noise (white noise). A feature in this case is that a frequency suitable for applying vibration to the mirror 2 can be checked by measuring a transfer function. In addition, since the vibration frequency of the mirror 2 includes a plurality of frequency components, the induced electromotive force in the target VCM 4 can be measured at once with respect to the plurality of frequency components. This can shorten the analysis time and increase the width of analysis (that is, reduce the false detection of an abnormality in the target VCM 4).

[Method of Detecting Abnormalites in Plurality of Actuators]

Figure 5:
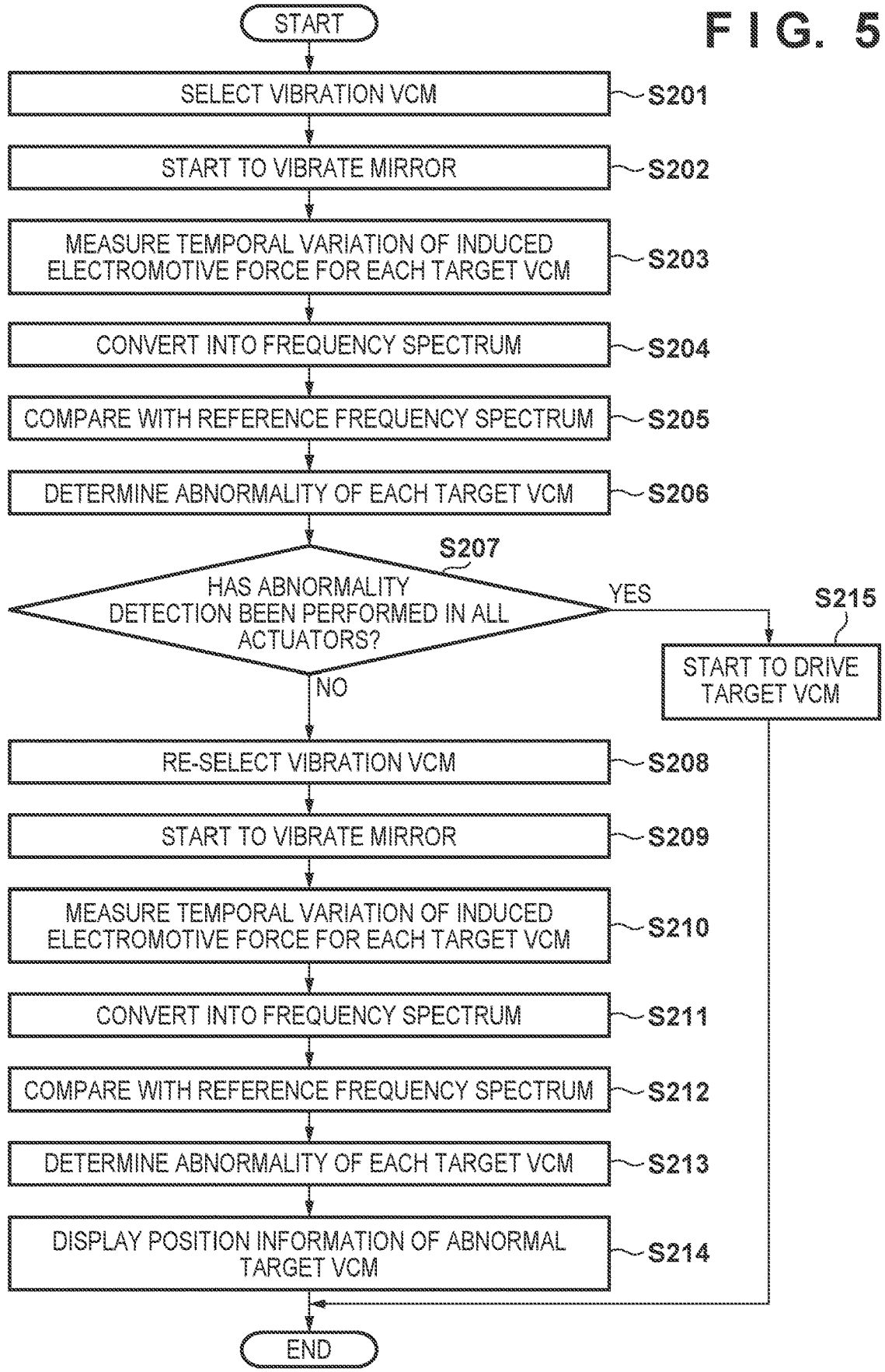
FIG. 5 is a flowchart showing a method of detecting abnormalities in a plurality of actuators.

A method of detecting an abnormality in each of a plurality of actuators AT used in the deformation apparatus 1 will be described next. FIG. 5 is a flowchart showing a method of detecting abnormalities in the plurality of actuators AT. The controller 7 performs each step in the flowchart shown in FIG. 5.

In step S201, the controller 7 selects the vibration VCM 5 driven to vibrate the mirror 2 from the plurality of actuators AT. Of the plurality of actuators AT, an actuator that has not been selected as the vibration VCM 5 is set as the target VCM 4 in which an abnormality is to be detected by measuring an induced electromotive force, and the driving operation as the actuator that applies a force to the mirror 2 (that is, the power feeding to the coil) is stopped. For example, the controller 7 can select the vibration VCM 5 so as to make it possible to vibrate the region of the mirror 2, on which the plurality of targets VCM 4 are arranged, by using one vibration VCM 5.

Figure 6A:
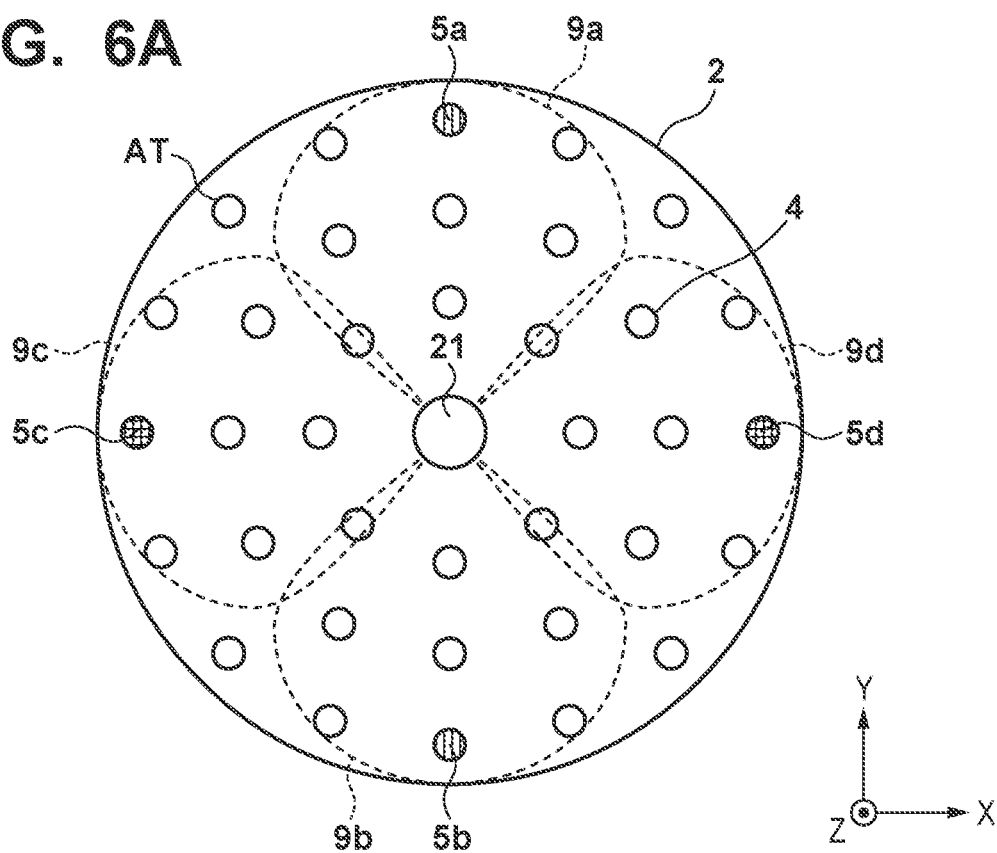
FIGS. 6A and 6B are views showing an example of selection of a vibration VCM.

For example, in this process, the controller 7 can select vibration VCMs 5a to 5d, as shown in FIG. 6A. FIG. 6A shows an example of selecting the vibration VCM 5 from the plurality of actuators AT arranged on the mirror 2. Referring to FIG. 6A, the four actuators AT, of the plurality of actuators AT, which are arranged on the outer peripheral portion of the mirror 2 at 45° interval around the center of the mirror holding member 21 are selected as the vibration VCMs 5a to 5d. FIG. 6A also shows ranges 9a to 9d on the mirror 2 which can be respectively vibrated by the vibration VCMs 5a to 5d. The plurality of actuators AT are respectively arranged as the target VCMs 4 in the ranges 9a to 9d.

In the example shown in FIG. 6A, the actuators AT arranged on the outer peripheral portion of the mirror 2 are selected as the vibration VCMs 5. However, the actuators AT arranged on the inner peripheral portion of the mirror 2 may be selected as the vibration VCMs 5. In addition, the number of vibration VCMs 5 can be arbitrarily determined. Arranging the vibration VCMs 5 point-symmetrically about the center of the mirror 2 as shown in FIG. 6A is effective in terms of reducing the vibration unevenness of the mirror 2.

In this case, as the number of vibration VCMs 5 decreases, induced electromotive forces can be measured in more targets VCM 4, but the vibration amount of the mirror 2 decreases. In contrast to this, as the number of vibration VCMs 5 increases, the number of target VCMs 4 in which induced electromotive forces can be measured decreases, but the vibration amount of the mirror 2 can be increased. When the mirror 2 is vibrated by the vibration VCM 5, the movable element 41 (magnet) of the target VCM 4 attached to the reverse surface 2b of the mirror 2 vibrates. As the movable element 41 vibrates, the interlinkage magnetic flux extending through the stator 42 (coil) of the target VCM 4 changes. This can generate an induced electromotive force in the stator 42 (coil).

In step S202, the controller 7 starts to vibrate the mirror 2 by using the vibration VCMs 5a to 5d selected in step S201. In this process, the controller 7 may drive the vibration VCMs 5a to 5d in the same phase. However, shifting the phases (drive phases or control phases) in which the vibration VCMs 5 are driven can increase the vibration of the mirror 2. For example, the vibration VCMs 5a and 5b are driven in the same phase, and the vibration VCMs 5c and 5d are driven in the opposite phase to that of the vibration VCMs 5a and 5b. In this case, it is possible to efficiently vibrate the mirror 2 as a whole and increase the vibration amount (deformation amount) of the mirror 2. In addition, when the vibration VCMs 5 are arranged symmetrically with respect to the center of the mirror 2, driving them in opposite phases provides a beneficial effect. In contrast to this, when the vibration VCMs 5 are arranged asymmetrically, driving them in phases other than opposite phases sometime provides a beneficial effect. Such phase differences may be obtained from the state of the vibration of the overall mirror 2 upon modal analysis of the mirror 2, dynamic analysis at the time of vibration, or the like.

In step S203, the controller 7 causes the measurement device 6 to measure the temporal variation of the induced electromotive force generated in the coil of each target VCM 4. Upon completion of the measurement of the temporal variation of the induced electromotive force in each target VCM 4, the controller 7 causes the vibration VCMs 5*a* to 5*d* to finish applying vibration to the mirror 2. In this process, it is possible to concurrently measure the temporal variations of induced electromotive forces in the plurality of target VCMs 4. Note that step S203 is a process similar to steps S102 and S103 in the flowchart shown in FIG. 2, and hence a detailed description of the process will be omitted.

In step S204, the controller 7 converts the temporal variation of the induced electromotive force in the target VCM 4 measured in step S203 into a frequency spectrum. In step S205, the controller 7 obtains the difference between the frequency spectrum obtained in step S204 and a reference frequency spectrum by comparing them for each target VCM 4. Available comparison methods include, for example, comparing the absolute values or correlation coefficients of the frequency spectrum obtained in step S204 and the reference frequency spectrum at an arbitrary frequency. When an impulse-like driving method, a pulse-like driving method, or a stepwise driving method is used as a method of driving the vibration VCM 5, frequencies are distributed in a wide band. Accordingly, comparing correlation coefficients provides a beneficial effect. In contrast to this, when a driving operation is to be performed with a single frequency, the peaks of the frequency distribution concentrate at the driving frequency. Accordingly, comparing the absolute values of induced electromotive forces at a single frequency at which peaks are generated provides a beneficial effect. Note that steps S204 and S205 are a process similar to that of steps S104 and S105 in the flowchart shown in FIG. 2, and hence a detailed description of the process will be omitted.

In step S206, the controller 7 determines whether an abnormality has occurred in each target VCM 4. For example, if the difference obtained in step S205 is equal to or more than a threshold, the controller 7 can determine that the abnormality has occurred in the target VCM 4. In contrast to this, if the difference is less than the threshold, the controller 7 can determine that no abnormality has occurred in the target VCM 4. Note that step S206 is a process similar to that of steps S106 to S108 in the flowchart shown in FIG. 2, and hence a detailed description of the process will be omitted.

In step S207, the controller 7 determines whether abnormality detection has been performed in all the actuators AT. For example, abnormality detection has not been performed in the actuator AT selected as the vibration VCM 5. In addition, as shown in FIG. 6A, abnormality detection has not been performed in the actuators AT that are not arranged in the ranges 9*a* to 9*d* on the mirror 2 to which vibration can be applied by the vibration VCMs 5*a* to 5*d* selected in step S201. If there is any actuator AT in which abnormality detection has not been performed as in this case, the process advances to step S208. In contrast to this, if abnormality detection has been performed in all the actuators AT, the process advances to step S215, in which the controller 7 starts to drive the target VCM 4 (that is, supply power to the coil) so as to deform the mirror 2 into a desired shape.

If the controller 7 determines in step S207 that there is the target VCM 4 in which the occurrence of an abnormality is determined in step S206, the process advances to step S208. If there is no target VCM 4 in which the occurrence of an abnormality has been determined, the process may advance to step S215. Note that if the number of target VCMs 4 in which the occurrence of an abnormality has been determined is small, an abnormality has likely occurred in the target VCM 4 itself. In contrast to this, if the number of target VCMs 4 in which the occurrence of an abnormality has been determined is large, it is highly possible that the abnormality has occurred in the vibration VCM 5 and vibration has not been properly applied to the mirror 2.

Figure 6B:
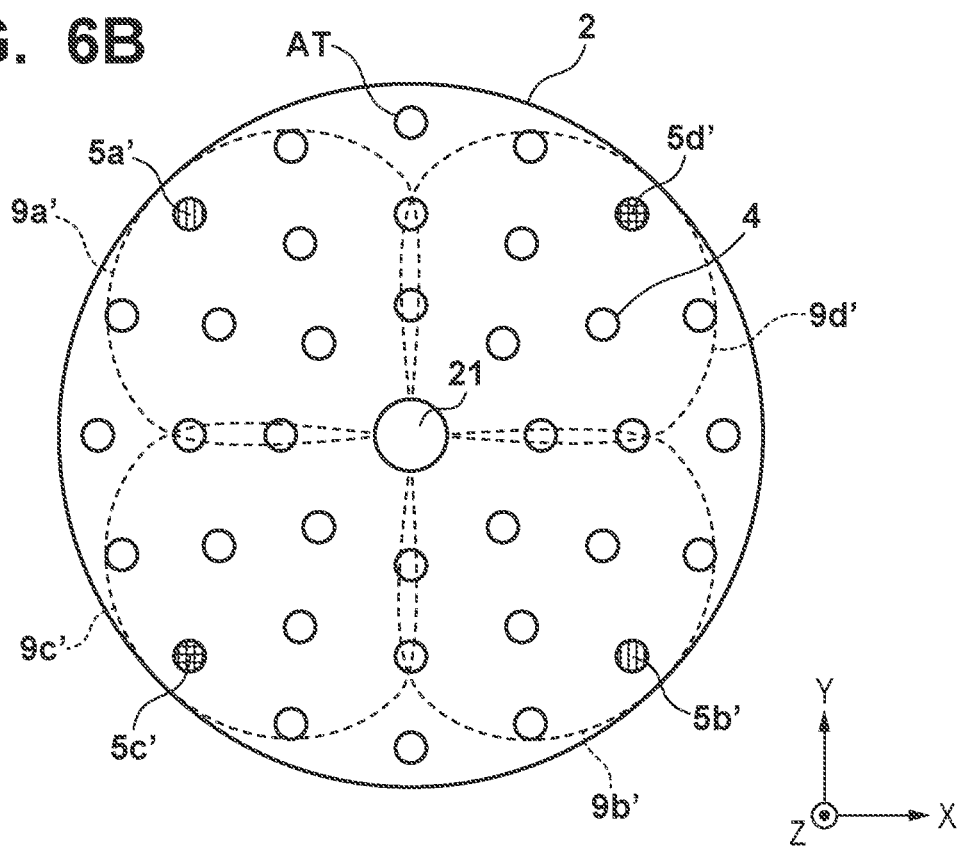

In step S208, the controller 7 re-selects the vibration VCM 5 to be driven to vibrate the mirror 2 from the plurality of actuators AT. For example, the controller 7 selects the vibration VCM 5 from the actuators AT that have not been selected as the vibration VCMs 5 in step S201. That is, the controller 7 can select, as the vibration VCM 5, the actuator AT that is different from the actuator AT selected as the vibration VCM 5 in step S201. For example, in this process, the controller 7 can select vibration VCMs 5*a'* to 5*d'*, as shown in FIG. 6B. FIG. 6B shows an example of selecting the vibration VCM 5 from the plurality of actuators AT arranged on the mirror 2. FIG. 6B also shows ranges 9*a'* to 9*d'* on the mirror 2 which can be respectively vibrated by vibration VCMs 5*a'* to 5*d'*. The actuators AT that are not included in the ranges 9*a* to 9*d* in FIG. 6A are respectively arranged as the target VCMs 4 in the ranges 9*a'* to 9*d'*.

Steps S209 to S213 are a process similar to that of steps S202 to S206 described above. In step S209, the controller 7 starts to apply vibration to the mirror 2 by using the vibration VCMs 5*a'* to 5*d'* selected in step S208. In step S210, the controller 7 causes the measurement device 6 to measure the temporal variation of the induced electromotive force generated in the coil of each target VCM 4, and causes the vibration VCMs 5*a'* to 5*d'* to finish vibrating the mirror 2 upon completion of the measurement of the temporal variation of the induced electromotive force in each target VCM 4. In step S211, the controller 7 converts the temporal variation of the induced electromotive force in each target VCM 4 measured in step S210 into a frequency spectrum. In step S212, the controller 7 compares the frequency spectrum obtained in step S211 with a reference frequency spectrum for each target VCM 4. In step S213, the controller 7 determines whether an abnormality has occurred in each target VCM 4.

In step S214, the controller 7 displays, on the display unit 8 (display), the position information of the actuator AT, of the plurality of actuators AT, in which an abnormality has been detected. For example, the controller 7 can display, in a recognizable state with different colors or the like on the display unit 8, the actuator AT in which the abnormality has been detected and the actuator AT in which no abnormality has been detected. In this case, the controller 7 may display, on the display unit 8, a measurement result on the induced electromotive force in each actuator AT, a frequency spectrum obtained from the measurement result, and the like in addition to the position information of the actuator AT in which the abnormality has been detected.

As described above, the deformation apparatus 1 according to this embodiment causes the measurement device 6 to measure the temporal variation of the induced electromotive force in the target VCM 4 (coil) while vibrating the mirror 2 by using the vibration VCM 5. The deformation apparatus 1 then converts the measured temporal variation of the induced electromotive force into a frequency spectrum and detects an abnormality in the target VCM 4 based on the frequency spectrum. Even if the induced electromotive force measured by the measurement device 6 is minute, an abnormality in the actuator AT can be efficiently and accurately detected.

Second Embodiment

Figure 7:
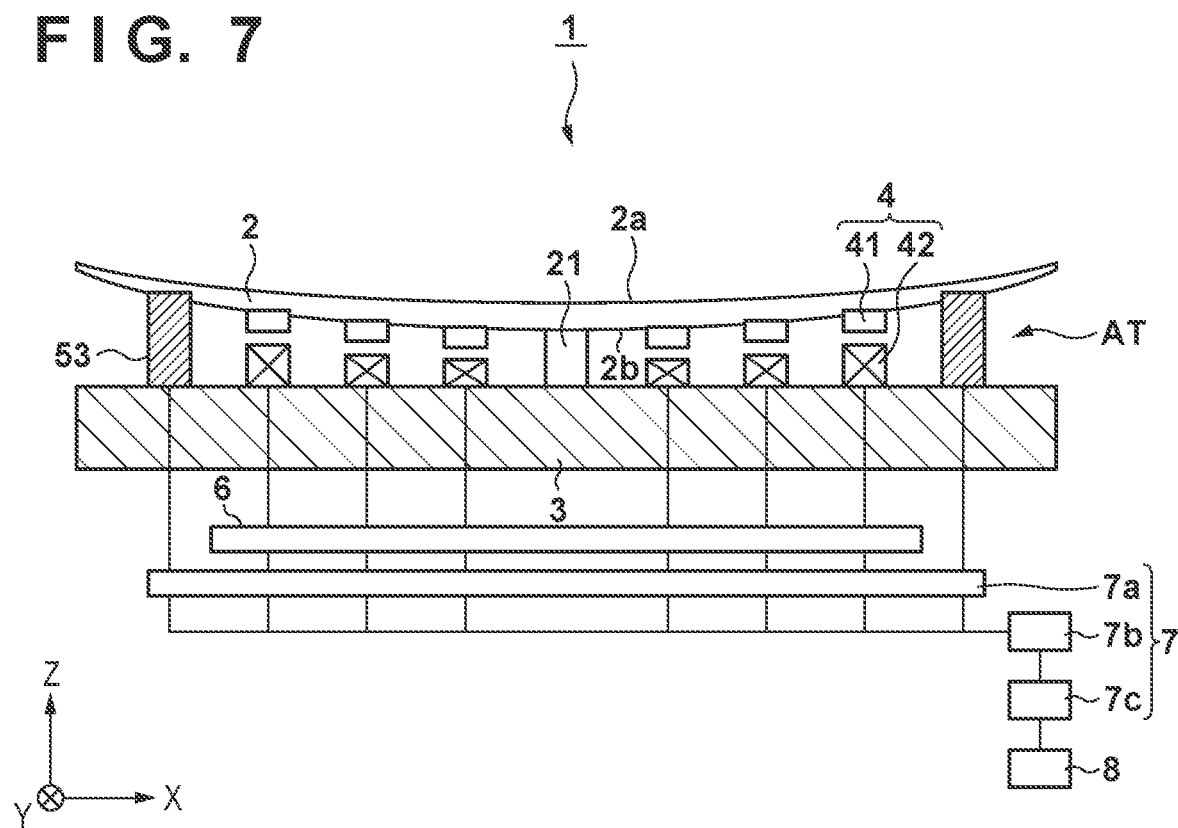
FIG. 7 is a schematic view showing the arrangement of a deformation apparatus according to the second embodiment.

FIG. 7 is a schematic view showing the arrangement of a deformation apparatus 1 according to the second embodiment of the present invention. As shown in FIG. 7, the deformation apparatus 1 according to this embodiment includes a contact type actuator 53 such as a piezoelectric element as an actuator AT driven to vibrate a mirror 2 in place of a vibration VCM 5. The actuators 53 are arranged on a base plate 3 to support the mirror 2. The arrangement and driving method of the actuators 53 are obvious from the above description except that the vibration VCM 5 in the first embodiment described above is replaced with the actuator 53, and hence a detailed description of them will be omitted.

Third Embodiment

Figure 8:
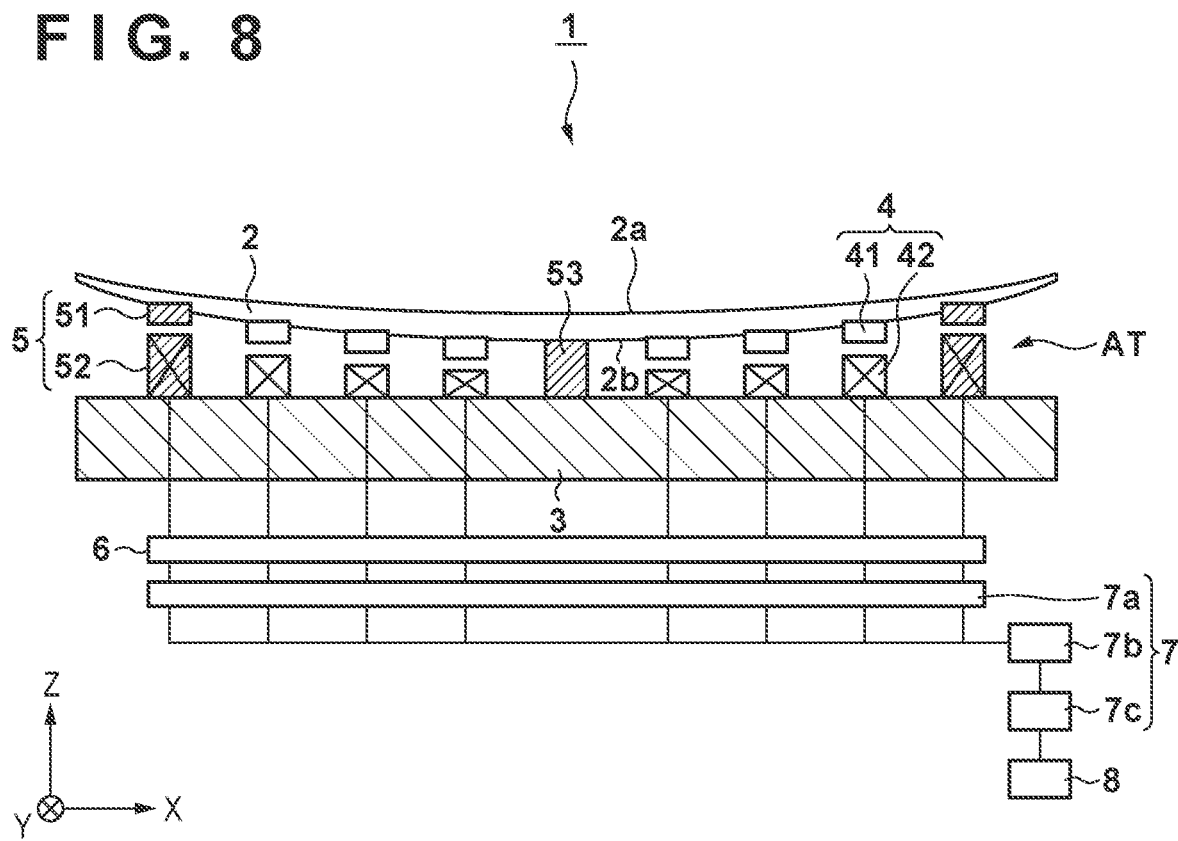
FIG. 8 is a schematic view showing the arrangement of a deformation apparatus according to the third embodiment.

FIG. 8 is a schematic view showing the arrangement of a deformation apparatus 1 according to the third embodiment of the present invention. As shown in FIG. 8, the deformation apparatus 1 according to this embodiment makes a mirror holding member 21 function as an actuator 53. A mirror 2 is supported by a base plate 3 through the actuator 53. In the embodiment, the actuator 53 as a holding member fixing the mirror 2 can apply vibration to the mirror 2. This reduces the number of fixing portions that interfere with the vibration of the mirror 2 and hence can greatly vibrate the mirror 2, thus producing a beneficial effect in generating a large induced electromotive force in each target VCM 4.

Fourth Embodiment

Figure 9:
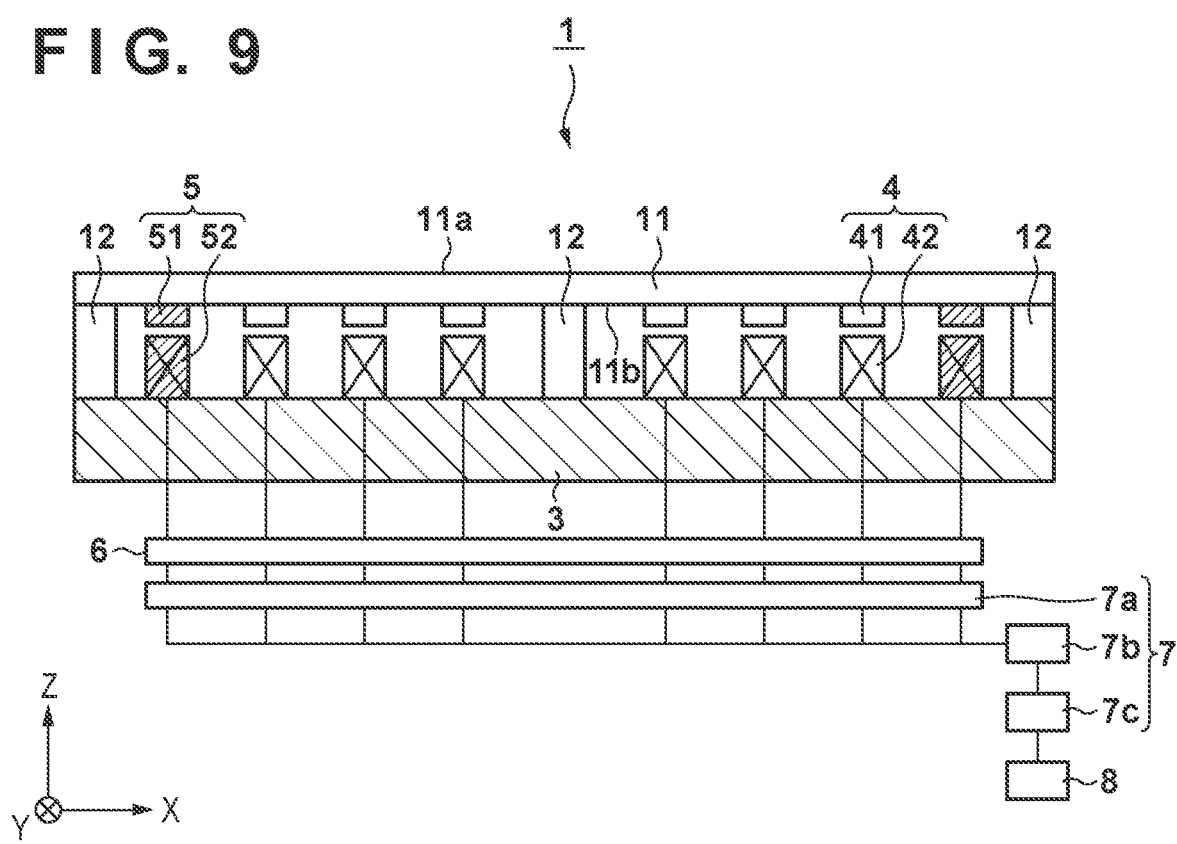
FIG. 9 is a schematic view showing the arrangement of a deformation apparatus according to the fourth embodiment.

FIG. 9 is a schematic view showing the arrangement of a deformation apparatus 1 according to the fourth embodiment of the present invention. The deformation apparatus 1 according to this embodiment can be used to deform the surface (the mask holding surface or substrate holding member) of a member such as a plate chuck 11 (a mask chuck or substrate chuck) instead of the mirror 2 (optical element). The embodiment is obtained by replacing the mirror 2 according to the first to third embodiment with the plate chuck 11.

The plate chuck 11 is supported by a base plate 3 through a holding member 12. Like the mirror 2, a surface 11a (holding surface) of the plate chuck 11 is deformed into a desired shape by actuators AT arranged on a surface (reverse surface) 11b on the opposite side to the surface 11a of the plate chuck. The arrangement and driving method of the actuators AT are similar to those in the first embodiment described above, and hence a detailed description of them will be omitted.

Embodiment of Exposure Apparatus

Figure 10:
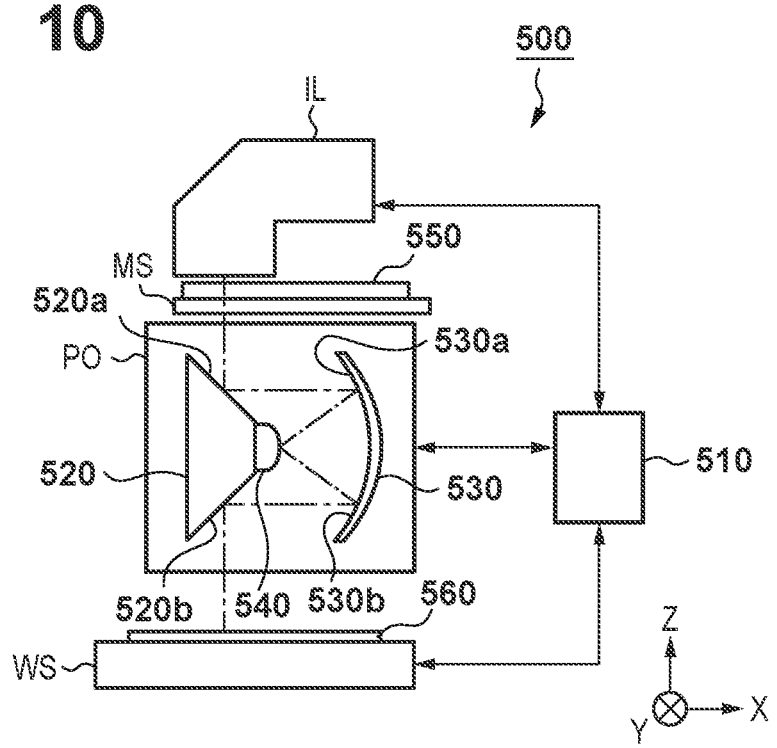
FIG. 10 is a schematic view showing the arrangement of an exposure apparatus.

FIG. 10 is a schematic view showing the arrangement of an exposure apparatus 500 as one aspect of the present invention. The exposure apparatus 500 is a lithography apparatus that transfers (forms) a mask pattern onto a substrate. The exposure apparatus 500 includes an illumination optical system IL, a projection optical system PO, a mask stage MS that holds and moves a mask 550, and a substrate stage WS that holds and moves a substrate 560. The exposure apparatus 500 also includes a controller 510 that controls the process of exposing a substrate 560. Note that the X, Y, and Z coordinate axes used in this embodiment do not necessarily coincide with the X, Y, and Z coordinate axes used in the first to fourth embodiments.

Light emitted from a light source (not shown) forms, for example, an arcuated illumination region long in the Y direction on the mask 550 using a slit (not shown) included in the illumination optical system IL. The mask 550 and the substrate 560 are respectively held by the mask stage MS and the substrate stage WS and arranged at optically conjugate positions (the object surface and image surface of the projection optical system PO). The projection optical system PO is an optical system that has a predetermined projection magnification and projects the pattern of the mask 550 onto the substrate 560. The mask stage MS and the substrate stage WS are relatively scanned at a speed ratio corresponding to the projection magnification of the projection optical system PO in a direction parallel to the object surface of the projection optical system PO (for example, the X direction). This can transfer the pattern of the mask 550 onto the substrate 560.

As shown in FIG. 8, for example, the projection optical system PO includes a planar mirror 520, a concave mirror 530, and a convex mirror 540. The optical path of light that is emitted from the illumination optical system IL and passes through the mask 550 is bent by a first surface 520a of the planar mirror 520 and enters a first surface 530a of the concave mirror 530. The light reflected by the first surface 530a of the concave mirror 530 is reflected by the convex mirror 540 and enters a second surface 530b of the concave mirror 530. The optical path of the light reflected by the second surface 530b of the concave mirror 530 is bent by a second surface 520b of the planar mirror 520 and is formed into an image on the substrate 560. The surface of the convex mirror 540 of the projection optical system PO having this arrangement serves as an optical pupil.

In the exposure apparatus 500, the deformation apparatus 1 according to each of the first to third embodiments is used as an optical apparatus that deforms the reflecting surface of the mirror included in the projection optical system PO. For example, the deformation apparatus 1 can be used as an optical apparatus that deforms the reflecting surface of the concave mirror 530. This makes it possible to deform the reflecting surface (the first surface 530a and the second surface 530b) of the concave mirror 530 into a predetermined shape and to accurately correct the aberration of the projection optical system PO. In addition, the deformation apparatus 1 according to the fourth embodiment can be used as an apparatus that deforms the holding surface of the mask chuck of the mask stage MS for the mask 550 and/or an apparatus that deforms the holding surface of the substrate chuck of the substrate stage WS for the substrate 560. Note that the controller 510 of the exposure apparatus 500 may be configured so as to include a controller 7 of a deformation apparatus 1.

Figure 11:
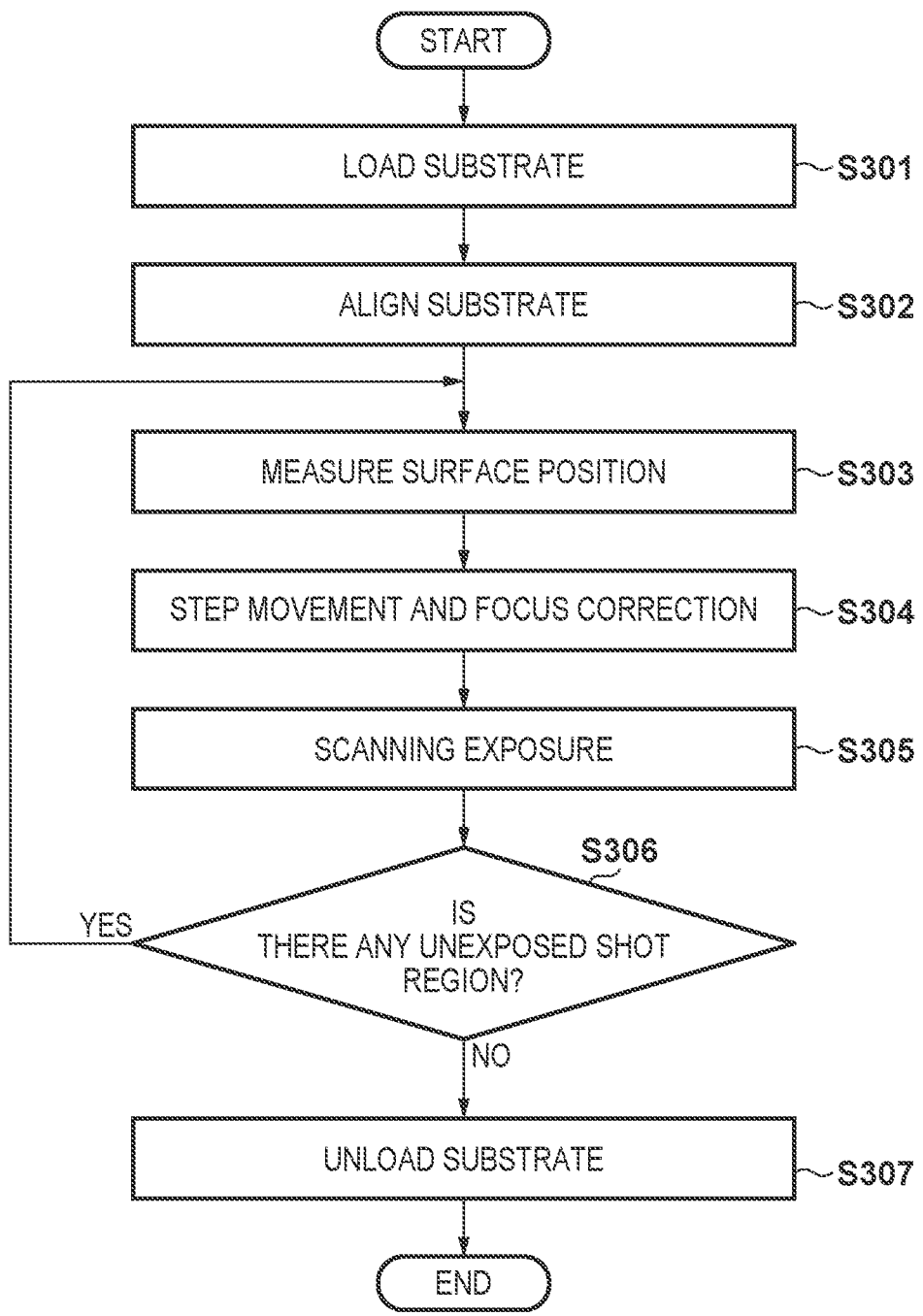
FIG. 11 is a flowchart showing an exposure sequence in the exposure apparatus.

The execution timing of abnormality detection in the deformation apparatus 1 (actuators AT) of the exposure apparatus 500 will be described below. FIG. 11 is a flowchart showing an exposure sequence in the exposure apparatus 500.

In step S301, the substrate 560 whose surface is coated with a resist is loaded into the exposure apparatus 500. In step S302, the positions of marks formed on the substrate 560 are detected, and the substrate 560 is aligned with the exposure apparatus 500 in the X and Y directions. In step S303, a predetermined surface position on the substrate 560 is measured to acquire the surface shape of the substrate 560. In step S304, the substrate 560 is moved to locate an exposure region ER at a predetermined position on the substrate 560 to start exposing a target shot region on the substrate 560 (step movement). A plate 110 is aligned in the Z direction in accordance with the surface shape measured in step S303 to correct the focus. Note that the exposure region ER is a region on the substrate irradiated with light from the projection optical system PO.

In step S305, the exposure region ER (projection optical system PO) and the substrate 560 are relatively scanned to perform scanning exposure on the target shot region. In step S306, it is determined whether there is any unexposed shot region on the substrate 560. If there is an unexposed shot region, the flow returns to step S303 to perform scanning exposure on the unexposed shot region as a target shot region. If there is no unexposed shot region, the flow advances to step S307 to unload the substrate 560 from the exposure apparatus 500.

Figure 12:
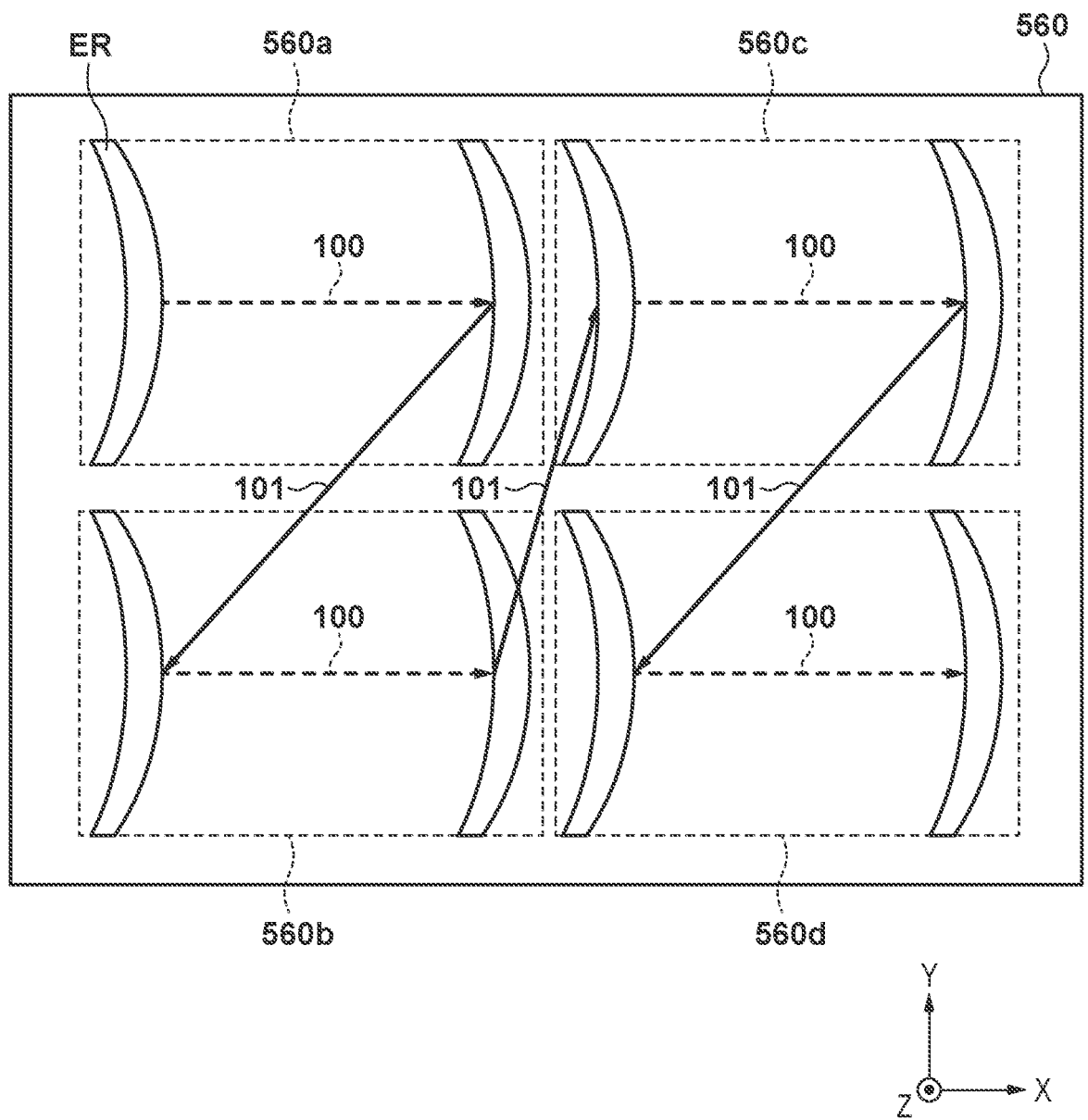
FIG. 12 is a view showing how scanning exposure is performed for each shot region on a substrate.

FIG. 12 shows how the above scanning exposure is performed on each of a plurality of (four) shot regions 560a to 560d on the substrate 560 (in other words, how the exposure region ER is moved on the substrate 560). Referring to FIG. 12, an arrow 100 indicates the movement of the exposure region ER on the substrate 560 in scanning exposure in step S305, and an arrow 101 indicates the movement of the exposure region ER on the substrate 560 in step movement in step S303.

Abnormality detection in the deformation apparatus 1 (actuators AT) described in the first embodiment can be executed in a process other than step S305 in the flowchart shown in FIG. 11. That is, abnormality detection in the deformation apparatus 1 can be executed at an arbitrary timing in steps S301 to S304, S306, and S307. For example, abnormality detection can be executed in step movement when scanning exposure is repeatedly performed (see step S303 and the arrows 101 in FIG. 12).

Embodiment of Method of Manufacturing Article

A method of manufacturing an article according to an embodiment of the present invention is suitable for manufacturing an article, for example, a microdevice such as a semiconductor device or an element having a microstructure. The method of manufacturing the article according to this embodiment includes a step of forming a latent image pattern on a photosensitizing agent applied on a substrate using the above-described exposure apparatus (a step of exposing the substrate) and a step of developing (processing) the substrate on which the latent image pattern is formed in the preceding step. This manufacturing method further includes other known steps (oxidation, deposition, vapor deposition, doping, planarization, etching, resist separation, dicing, bonding, packaging, and the like). The method of manufacturing the article according to this embodiment is advantageous in at least one of the performance, the quality, the productivity, and the production cost of the article, as compared to a conventional method.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-097146 filed on Jun. 3, 2020, which is hereby incorporated by reference herein in its entirety.

What is claimed is:

1. A deformation apparatus that deforms a surface of a member, the apparatus comprising:
   a plurality of actuators each of which is configured to apply a force to the member to deform the surface;
   a measurement device configured to measure an induced electromotive force generated in a first actuator of the plurality of actuators; and
   a controller configured to control the plurality of actuators,
   wherein the controller causes the measurement device to measure a temporal variation of an induced electromotive force in the first actuator while vibrating the member by using a second actuator, of the plurality of actuators, which is different from the first actuator, converts the measured temporal variation of the induced electromotive force into a frequency spectrum, and detects an abnormality in the first actuator based on the frequency spectrum.

2. The apparatus according to claim 1, wherein the controller controls the second actuator such that a vibration frequency of the member includes a single frequency component, in a case of causing the measurement device to measure the temporal variation of the induced electromotive force generated in the first actuator.

3. The apparatus according to claim 1, wherein the controller controls the second actuator such that a vibration frequency of the member includes a plurality of frequency components, in a case of causing the measurement device to measure the temporal variation of the induced electromotive force generated in the first actuator.

4. The apparatus according to claim 3, wherein the controller controls the second actuator so as to sweep a vibration frequency of the member in a case of causing the measurement device to measure the temporal variation of the induced electromotive force generated in the first actuator.

5. The apparatus according to claim 4, wherein the controller controls the second actuator so as to sweep a vibration frequency of the member in a range from 20 Hz to 120 Hz.

6. The apparatus according to claim 3, wherein the controller controls the second actuator such that a vibration frequency of the member includes white noise, in a case of causing the measurement device to measure the temporal variation of the induced electromotive force generated in the first actuator.

7. The apparatus according to claim 1, wherein the controller controls the second actuator such that a vibration frequency of the member includes a resonance frequency of the member, in a case of causing the measurement device to measure the temporal variation of the induced electromotive force generated in the first actuator.

8. The apparatus according to claim 1, wherein the controller controls a plurality of second actuators such that drive phases of the plurality of second actuators shift from each other, in a case of causing the measurement device to measure the temporal variation of the induced electromotive force in the first actuator while vibrating the member using the plurality of second actuators.

9. The apparatus according to claim 1, wherein the controller detects an abnormality in the first actuator by comparing the frequency spectrum converted from the temporal variation of the induced electromotive force with a reference frequency spectrum.

10. The apparatus according to claim 1, wherein the controller causes the measurement device to concurrently measure the temporal variation of the induced electromotive force in each of a plurality of first actuators while vibrating the member using the second actuator.

11. The apparatus according to claim 1, wherein
the plurality of actuators are arranged between the member and a base plate supporting the member,
the first actuator comprises a magnet fixed to one of the member and the base plate, and a coil fixed to the other of the member and the base plate, and
the measurement device measures an induced electromotive force in the coil.

12. The apparatus according to claim 1, wherein the first actuator and the second actuator are actuators of the same type.

13. The apparatus according to claim 1, wherein the first actuator and the second actuator are actuators of different types.

14. The apparatus according to claim 1, wherein the number of first actuators is smaller than the number of second actuators.

15. An exposure apparatus that exposes a substrate, the apparatus comprising
a projection optical system configured to project a mask pattern onto the substrate,
wherein the projection optical system includes a deformation apparatus defined in claim 1, and
the deformation apparatus deforms, as a surface of the member, an optical surface of an optical element included in the projection optical system.

16. A method of manufacturing an article, the method comprising:
exposing a substrate by using an exposure apparatus defined in claim 15; and
developing the substrate exposed in the exposing.

* * * * *